United States Patent [19]

Lappington

[11] 4,128,900

[45] Dec. 5, 1978

[54] PROGRAMMABLE READ ONLY MEMORY FOR ELECTRONIC ENGINE CONTROL

[75] Inventor: John P. Lappington, Huntsville, Ala.

[73] Assignee: Chrysler Corporation, Highland Park, Mich.

[21] Appl. No.: 875,344

[22] Filed: Feb. 6, 1978

Related U.S. Application Data

[62] Division of Ser. No. 709,467, Jul. 28, 1976, Pat. No. 4,084,240.

[51] Int. Cl.$^2$ .......................... G11C 17/00; G11C 8/00

[52] U.S. Cl. .......................................... 365/94; 365/230; 365/184

[58] Field of Search .................. 365/94, 168, 230, 184

[56] References Cited

U.S. PATENT DOCUMENTS

| | | | |
|---|---|---|---|
| 3,824,564 | 7/1974 | Wegener | 365/184 |
| 3,895,360 | 7/1975 | Cricchi et al. | 365/184 |
| 3,906,461 | 9/1975 | Cappon | 365/184 |

*Primary Examiner*—Stuart N. Hecker
*Attorney, Agent, or Firm*—Baldwin & Newtson

[57] ABSTRACT

An electronic engine control system comprises a central microprocessor integrated circuit, a program memory integrated circuit, and a programmable read only memory integrated circuit. The central microprocessor integrated circuit carries out calculations used in controlling an event associated with the engine according to a basic program contained in the program memory integrated circuit. The programmable read only memory integrated circuit is programmed to tailor the basic program contained in the program memory integrated circuit for the particular engine with which the electronic control system is utilized.

1 Claim, 4 Drawing Figures

FIG. 2
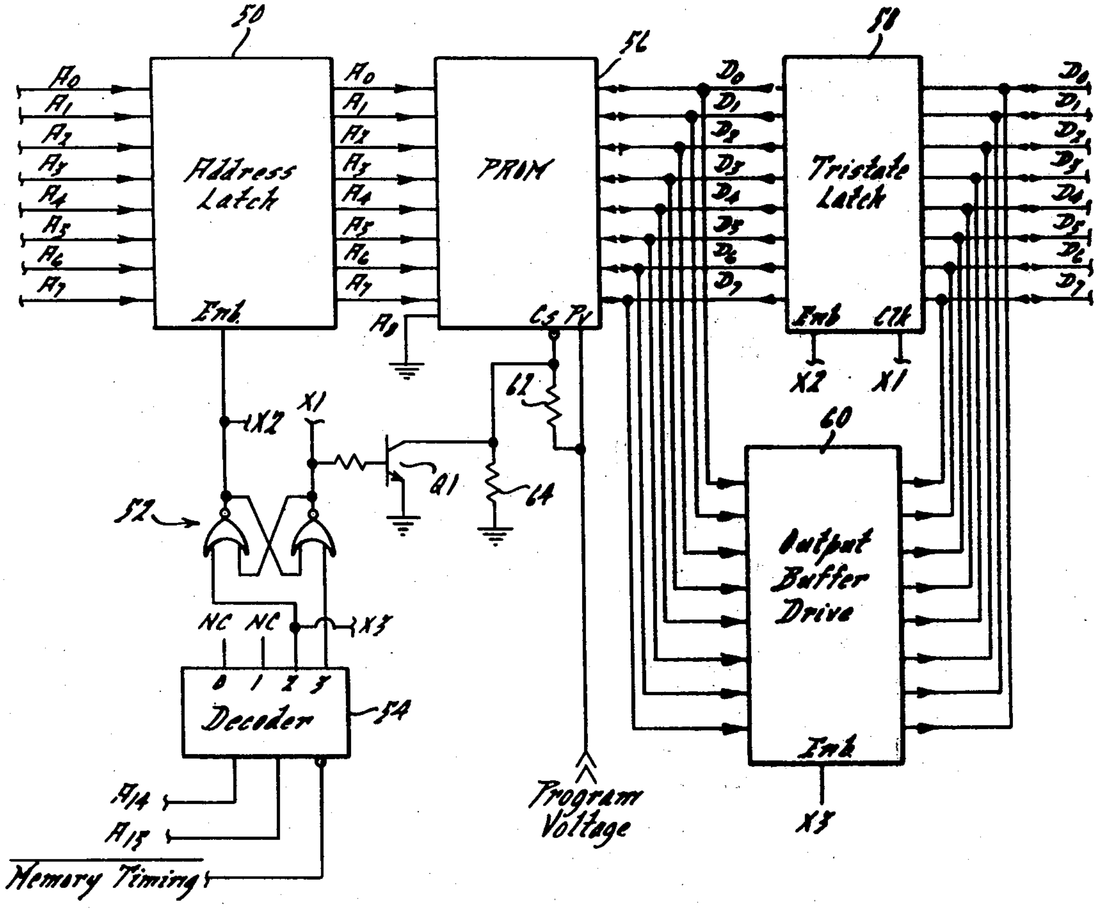
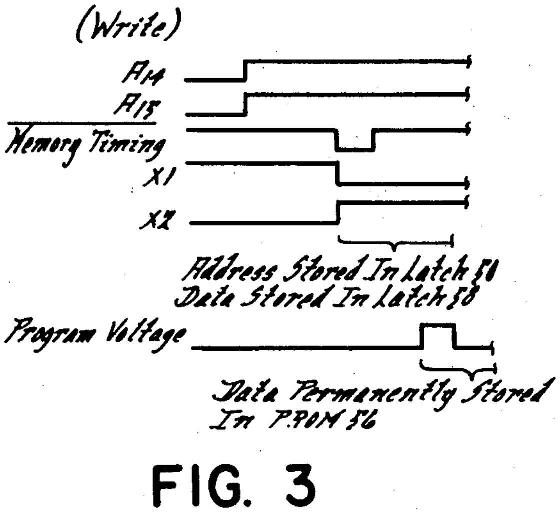
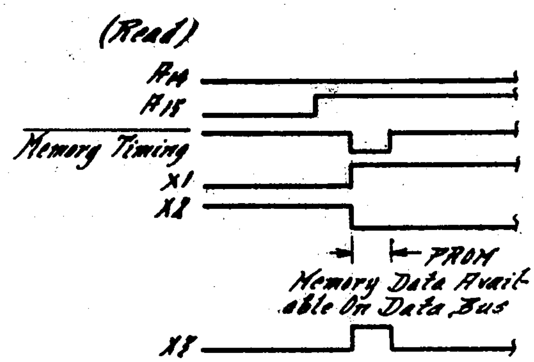
FIG. 3
FIG. 4

PROGRAMMABLE READ ONLY MEMORY FOR ELECTRONIC ENGINE CONTROL

This is a division of application Ser. No. 709,467, filed, July 28, 1976, now U.S. Pat. No. 4,084,240.

BACKGROUND AND SUMMARY OF THE INVENTION

The present invention pertains to electronic engine control systems and is concerned specifically with a control system having a central microprocessor.

The application of electronic controls to engine control systems accomplishes substantial improvements in engine performance. An outstanding example is the Chrysler electronic lean burn engine which monitors, via input sensors, various engine operating conditions to precisely control the timing of spark ignition. This remarkable engine achieves reduced exhaust emissions and improved fuel economy without the use of other devices (such as catalytic converters, exhaust gas recirculation) which had heretofore been required on internal combustion engines to meet Federal emission standards and which lowered fuel economy. The Chrysler electronic lean burn engine, as currently manufactured and sold by Chrysler Corporation, utilizes several analog sensors and analog circuits for converting the sensor information into analog electrical signals utilized in controlling spark timing.

The desirability of utilizing digital, as opposed to analog circuits, has heretofore been recognized in engine control systems. In particular, recent advances in microprocessor technology render the incorporation of a central digital microprocessor in an engine control system especially advantageous. In a system embodying such a device, the microprocessor carries out calculations utilized in controlling an event associated with operation of the engine, the calculations being established according to a program electronically contained in program circuitry operatively associated with the central microprocessor.

The present invention is concerned with a novel implementation of a microprocessor engine control system whereby manufacturing complexities, associated with mass production of such systems, are considerably simplified. The present invention envisions the fabrication of a basic electronic control unit containing the microprocessor engine control circuitry at an electronics manufacturing plant. The electronic control unit, at the time of shipment from the electronics manufacturing plant, has the potential for use with any of various different engine models, each having its own unique requirements for an electronic control unit. When either the engine manufacturing plant or the vehicle assembly plant determine on what model engine a given electronic control unit will be used, that control unit is electronically tailored for use with the given engine. Therefore, only one basic electronic control unit need be manufactured by the electronics manufacturing plant and stocked in a subsequent facility (such as an engine plant, assembly plant, or parts supply depot); yet the unique requirements of different engines can be readily accommodated.

The foregoing features, advantages, and benefits of the present invention, along with additional ones, will be seen in the ensuing description and claims which are to be considered in conjunction with accompanying drawings.

BRIEF DESCRIPTION OF THE DRAWINGS

The drawings illustrate a preferred embodiment of the present invention according to the best mode presently contemplated in carrying out the invention.

FIG. 2 illustrates a more detailed schematic diagram of a portion of FIG. 1.

FIGS. 3 and 4 are waveform timing diagrams useful in explaining the system.

DESCRIPTION OF THE PREFERRED EMBODIMENT

Figure 1:
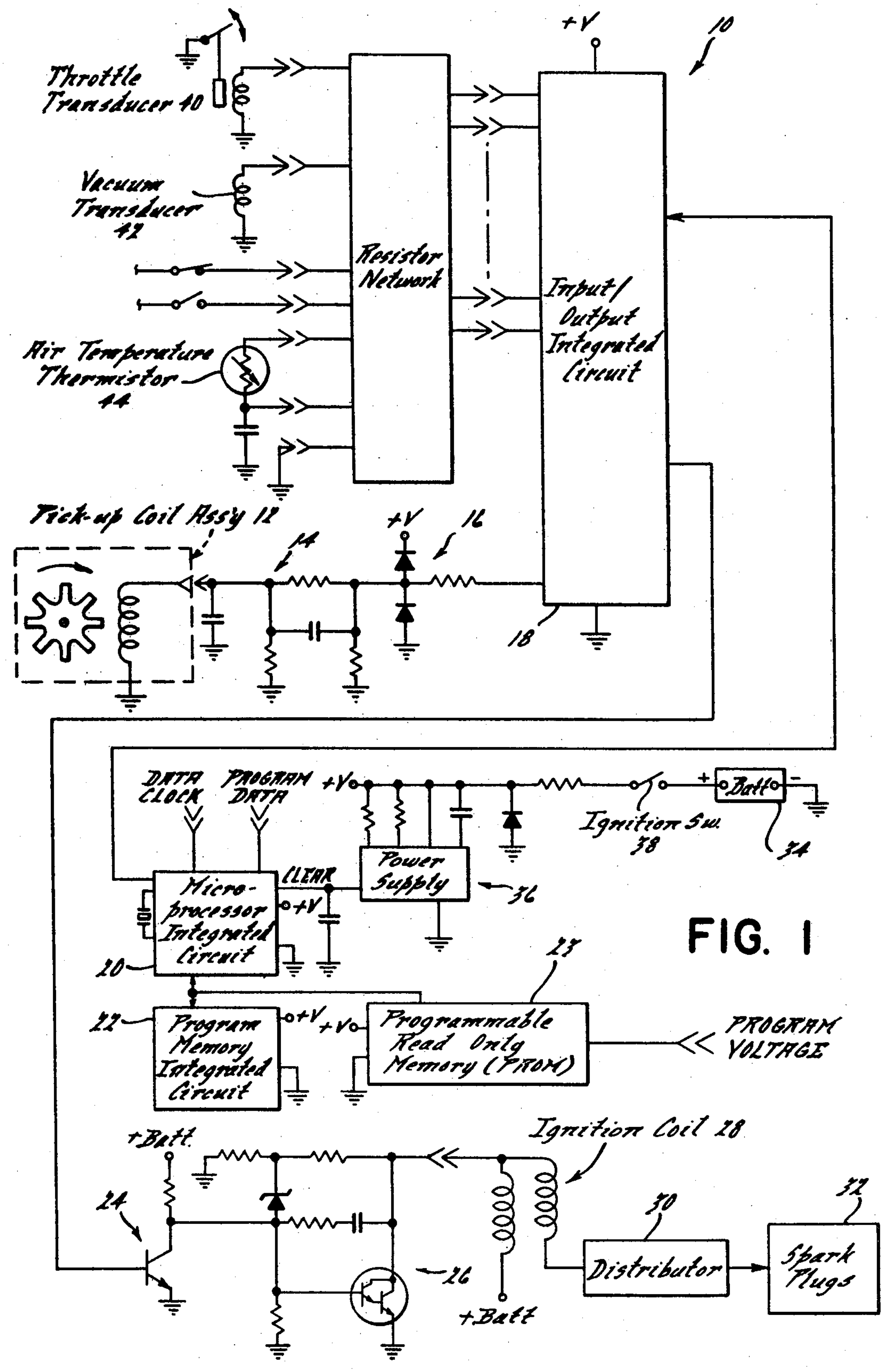
FIG. 1 illustrates an electronic schematic diagram of engine control system embodying principles of the present invention.

The drawings disclose an illustrative preferred embodiment of engine control system 10 which is an engine spark timing control system wherein the time of spark ignition in the cylinders of the engine is controlled in accordance with selected input signals which are representative of the values of selected operating conditions. Briefly, a conventional pick-up coil assembly 12 is operatively coupled with the crankshaft of the engine to provide trigger pulses at predetermined angular positions of the crankshaft. The trigger pulses are supplied successively through a filter circuit 14 and a clipper circuit 16 to an input/output integrated circuit 18. Input/output integrated circuit 18 is a microcircuit device comprising a plurality of individual circuits which provide an interface, or buffer, between a microprocessor integrated circuit 20, a program memory integrated circuit 22, and a programmable read only memory integrated circuit 23 (hereinafter referred to as a PROM) on the one hand, and a number of discrete circuits on the other hand. Details of input/output integrated circuit 18 are disclosed in the copending application of John P. Lappington and Leroy Shafer entitled Input Sensor Circuit for a Digital Engine Controller filed on or about May 20, 1976 and having Ser. No. 688,217 now U.S. Pat. No. 4,060,714. Included among the discrete circuits referred to above are the previously described pick-up circuit, a plurality of input circuits supplying signals representative of selected operating conditions, and an ignition circuit via which spark firing in the cylinders of the engine is accomplished. The ignition circuit comprises a predriver stage 24 followed by an output stage 26 which is operatively coupled with a conventional ignition coil 28 having primary and secondary windings. The secondary winding is connected via the usual distributor 30 with the spark plugs 32 of the engine. The primary winding is operatively connected with output stage 26. The overall operation of the system is such that in response to each trigger pulse from pick-up coil assembly 12, a selected one of the spark plugs is fired. The timing of ignition firing is controlled by microprocessor integrated circuit 20 which calculates from the selected input signals the correct duration of a time delay and then gives a firing signal to predriver stage 24 which is time delayed from the pick-up trigger signal by the calculated delay. Calculations for establishing the time of spark ignition are made by microprocessor integrated circuit 20 which acts upon a program defined by program memory integrated circuit 22 and PROM 23 pursuant to principles of the present invention hereinafter set forth in detail. Electrical power for the system is derived from the usual vehicle battery 34. In order to provide a regulated voltage potential of +V volts for the microelectronics, a conventional power supply circuit 36 is operatively connected as illustrated via the vehicle ignition switch 38 to be energized from battery 34 when the ignition switch is actuated to the on position. In addition to providing the regulated potential of +V volts, power supply 36 also provides a CLEAR signal used to clear microprocessor integrated circuit 20 when the ignition switch is first turned on to operate the engine.

The present invention relates to an improved electronic engine control system provided by microprocessor integrated circuit 20, program memory integrated circuit 22, and PROM 23. Microprocessor integrated circuit 20 is a conventional device (for example, RCA Corporation CDP 1802D microprocessor) which carries out calculations used in computing the delay of spark firing in relation to each pulse from pick-up coil assembly 12. The amount of the delay is a function of the several selected conditions which are sensed by the control circuit such as, throttle position by a throttle position transducer 40, intake manifold vacuum via a vacuum transducer 42, and temperature of ambient air entering the engine for combustion as sensed by an air temperature thermistor 44. Details of the sensor circuits are disclosed in the above-referenced copending patent application. Program memory integrated circuit 22 is a conventional read only memory, (for example, RCA Corporation CDP 1832D, ROM). Program memory integrated circuit 22 is programmed to provide a predetermined basic spark timing program which is executed by microprocessor integrated circuit 20. The program is established according to conventional programming techniques to carry out the desired spark timing delay calculations, based on the values of the selected input conditions which are monitored. However, in accordance with the present invention, PROM 23 tailors the basic program contained in program memory integrated circuit 22 for use with the particular engine with which the control system is utilized.

A detailed schematic diagram illustrating one possible implementation of PROM 23 from several standard, commercially available components is shown in FIG. 2; it is contemplated that in mass-production of the illustrated control system these (or equivalents thereof) would be integrated into a single chip. FIG. 2 contains an address latch 50, a flip-flop 52, a decoder 54, a PROM 56, a tristate latch 58, and an output buffer drive 60. Address latch 50 can comprise two RCA CD4042's connected to receive an address from microprocessor 20 via bits A0, A1, A2, A3, A4, A5, A6, and A7 of an address bus and to supply same to PROM 56. Operation of latch 50 is controlled by the level of a signal X2 supplied from flip-flop 52 to the "enable" terminal of the latch. PROM 56, an INTEL 2704, has data terminals D0, D1, D2, D3, D4, D5, D6, and D7 via which 8-bit data words are entered into and read from memory. The data terminals of PROM 56 are linked with microprocessor 20 via a bi-directional data bus containing tristate latch 58 and output buffer drive 60. Tristate latch 58 can be an RCA CD4508, and output buffer drive 60, a pair of Fairchild 340097's. The "enable" and "clock" terminals of tristate latch 58 are connected with flip-flop 52 to receive control signals X2 and X1 respectively; the "enable" terminal of output buffer drive 60 is connected with decoder 54 to receive control signal X3. The PROGRAM VOLTAGE signal is supplied directly to the "program voltage" terminal of PROM 56, and an attentuation thereof is supplied by the voltage dividing resistors 62, 64 to the "chip select" terminal thereof. The attentuated PROGRAM VOLTAGE signal at the "chip select" terminal can be grounded out by transistor Q1, which is connected with flip-flop 52. Decoder 54 can be an RCA CD14555 and is connected to decode the signals A14, A15 supplied from microprocessor 20. A $\overline{\text{MEMORY TIMING}}$ signal is also supplied to decoder 54 from microprocessor 20.

Data is entered into the memory of PROM 56 as follows. The address of the data word which is to be stored is received from microprocessor 20 and latched in address latch 50. The data word is received from microprocessor 20 and latched in tristate latch 58. The control signal causing the address and data word information to be latched is from flip-flop 52 which is set when address bits A14 and A15 are both high. A14 and A15 are both high only when new data is to be entered into the memory. With the address and data word both latched, the PROGRAM VOLTAGE pulse is applied to cause the latched data word to be permanently stored in the PROM at the address location designated by the latched address. The address latch 50 is reset when A14 is low and A15 high, and when it is so reset, the microprocessor is directly enabled to PROM 56. With address latch 50 reset, signal X3 is high so that stored data from PROM 56 can be output to microprocessor 20 via output buffer drive 60. Transistor Q1 enables reading the memory by grounding the "chip select" terminal; when transistor Q1 is not conducting, data can be entered into the memory.

FIGS. 3 and 4 illustrate respective timing diagrams of the various signals for storing (i.e. writing) data in the PROM and for reading data from the PROM respectively. The $\overline{\text{MEMORY TIMING}}$ signal is generated by the microprocessor and prevents data from being entered when an improper address is entered. It is to be understood that suitable power supplies are provided for the circuitry even though they are not shown on the drawing.

The inter-relationship between circuits 22 and 23 is illustrated by considering an illustrative spark timing equation which may be utilized in calculating the spark timing delay from the occurrence of each pick-up coil assembly trigger pulse.

$$\text{DELAY} = AF_1(\text{RPM}) + BF_2(\text{VACUUM}) + CF_3(\text{THROTTLE}) + DF_4(\text{AIRTEMP}) + E$$

where: A, B, C, and D are scale factors; E is an offset; $F_1$, $F_2$, $F_3$, and $F_4$ are functions of variables; and RPM, VACUUM, THROTTLE, and AIRTEMP are selected signal variables.

The RPM signal is derived from the frequency of the trigger signals from the pick-up coil assembly. The vacuum signal is derived from vacuum transducer 42. The throttle signal is derived from throttle position transducer 40, and the AIRTEMP signal, from air termperature thermistor 44. This equation may be considered as a basic spark timing equation applicable to all engine models with which the electronic control system is potentially applicable. However, because of unique characteristics of each engine model, the various individual terms of the equation such as $AF_1$, $BF_2$, etc., may be different for each engine model. The advantage of PROM 23 can now be explained. By programming program memory integrated circuit 22 with a program to execute the basic spark timing equation, the system is potentially useful with any engine model (assuming no data has yet been entered in PROM 23). This means that the complete control electronics can be fabricated and packaged as a single electronic control unit at the electronics manufacturing plant without regard to the engine model with which the unit will ultimately be used. Hence, the electronics manufacturing plant makes and ships only one model of electronic control unit. Once the particular engine model on which a given electronic control unit is to be used has been established, PROM 23 is programmed with data representing specific scale factors, offset, and/or functions which are unique to the engine and which have been previously defined to secure optimum performance.

Prom 23 is programmed in the following fashion, using conventional equipment and techniques. Three externally connectible terminals are utilized to program PROM 23. These are the data clock and program data terminals of microprocessor 20, and the program voltage terminal of PROM 56. The data clock terminal and program data terminal receive respectively DATA CLOCK signals and PROGRAM DATA signals from external equipment. A programming command instruction is first serially entered at the program data terminal, and this is recognized by the microprocessor as meaning that data is to be programmed into the PROM. Next the address in the PROM at which the data word is to be stored is serially entered at the program data terminal. Finally, the data word itself is entered at the program data terminal. The circuit acts upon these inputs in the manner described above so that the data is stored in the PROM at the desired address. The process is repeated for each item of data which is to be stored. Once stored, the data can be read at the appropriate time in the manner set forth above. It should be pointed out that the INTEL PROM 56 utilizes MNOS memory technology so that the data stored therein is permanently retained even when the D.C. power is turned off. While it is possible to erase the memory by exposure of PROM 56 to ultraviolet light, the environment of the present invention should preclude that possibility so that data storage is indeed truly permanent. The specific program data may be any or all of the following: scale factor(s), offset, and function(s). Moreover, linear and non-linear functions may be programmed. Zero values for specific scale factors may be programmed so that corresponding terms of the basic equation are in effect omitted. One significant advantage is therefore the versatility of the invention. Once the program data has been entered in PROM 23, it is truly permanent and, therefore, the electronic control unit is now unique to a particular engine. Another significant advantage of the invention is that insofar as the electronic manufacturing facility is concerned, it produces only a single electronic control unit model. Thus, inventory and parts complexity is greatly simplified since multiple unique control units for individual engines are not required.

What is claimed is:

1. A programmable read only memory integrated circuit and associated circuitry for reading and writing data from and on the programmable read only memory integrated circuit comprising in combination:

an address bus containing an address latch circuit;

means connecting the address bus to the address input of the programmable read only memory integrated circuit;

a bi-directional data bus containing a tri-state latch circuit and an output buffer drive circuit connected in parallel;

means connecting said bi-directional data bus to the data input/output of the programmable read only memory integrated circuit;

and control means for reading and writing data from and on the programmable read only memory integrated circuit via said bi-direcitonal data bus in accordance with addresses supplied via said address bus.

* * * * *